United States Patent
Fenouillet-Beranger et al.

(10) Patent No.: US 10,121,707 B2
(45) Date of Patent: Nov. 6, 2018

(54) METHOD OF FABRICATION OF A FET TRANSISTOR HAVING AN OVERLAPPED GATE

(71) Applicant: COMMISSARIAT A L'ENERGIE ATOMIQUE ET AUX ENERGIES ALTERNATIVES, Paris (FR)

(72) Inventors: Claire Fenouillet-Beranger, Voiron (FR); Philippe Coronel, Barraux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/816,328

(22) Filed: Nov. 17, 2017

(65) Prior Publication Data
US 2018/0144992 A1 May 24, 2018

(30) Foreign Application Priority Data
Nov. 18, 2016 (FR) .................... 16 61228

(51) Int. Cl.
| | |
|---|---|
| *H01L 21/00* | (2006.01) |
| *H01L 21/84* | (2006.01) |
| *H01L 21/3213* | (2006.01) |
| *H01L 21/265* | (2006.01) |
| *H01L 27/12* | (2006.01) |

(Continued)

(52) U.S. Cl.
CPC ........ *H01L 21/84* (2013.01); *H01L 21/26506* (2013.01); *H01L 21/306* (2013.01); *H01L 21/32133* (2013.01); *H01L 27/1207* (2013.01); *H01L 29/4916* (2013.01); *H01L 29/6656* (2013.01)

(58) Field of Classification Search
CPC ......... H01L 21/26506; H01L 21/32133; H01L 21/84

USPC .......................................................... 438/152
See application file for complete search history.

(56) References Cited

U.S. PATENT DOCUMENTS

| | | |
|---|---|---|
| 2004/0235262 A1 | 11/2004 | Lee et al. |
| 2005/0029619 A1 | 2/2005 | Forbes |

(Continued)

FOREIGN PATENT DOCUMENTS

| | | |
|---|---|---|
| WO | WO 2011/154360 A2 | 12/2011 |

OTHER PUBLICATIONS

French Preliminary Search Report dated Jul. 3, 2017 in French Application 16 61228, filed on Nov. 18, 2016 (with English Translation of Categories of cited documents).

*Primary Examiner* — David S Blum
(74) *Attorney, Agent, or Firm* — Oblon, McClelland, Maier & Neustadt. L.L.P.

(57) ABSTRACT

A method for making a FET transistor, including the following steps:
 making, on a crystalline semiconducting layer, a layer of gate dielectric on which a gate conducting layer is arranged,
 etching the conducting layer such that a remaining portion of this layer fully covers a first semiconducting portion forming an active zone and a second semiconducting portion adjacent to the active zone,
 implanting atoms and/or dopants in the semiconducting layer, thus amorphizing the semiconductor around the first portion and that of the second portion,
 etching the remaining portion of the conducting layer and of the dielectric layer according to a gate pattern partially covering the first portion and the second portion, forming the gate and a gate overflow,
 etching the amorphous semiconductor.

11 Claims, 14 Drawing Sheets

(51) Int. Cl.
    *H01L 29/49*     (2006.01)
    *H01L 29/66*     (2006.01)
    *H01L 21/306*     (2006.01)

(56) References Cited

U.S. PATENT DOCUMENTS

| | | |
|---|---|---|
| 2005/0059252 A1 | 3/2005 | Dokumaci et al. |
| 2012/0292700 A1 | 11/2012 | Khakifirooz et al. |
| 2016/0307809 A1 | 10/2016 | Andrieu et al. |

METHOD OF FABRICATION OF A FET TRANSISTOR HAVING AN OVERLAPPED GATE

TECHNICAL FIELD AND PRIOR ART

The invention relates to the field of FET transistors (Field Effect Transistors) and that of integrated circuits comprising FET transistors, advantageously three-dimensional integrated circuits (that is including several levels of electronic components superimposed with each other and connected to each other by levels of electrical interconnections). Such integrated circuits are advantageously used in the fields of electronics such as that of reconfigurable logic circuits, static memories (SRAM) or of the three-dimensional flash type, addressing memories, NEMS (Nano-ElectroMechanical Systems) sensors, ChemFET chemical sensors, etc.

In the field of integrated circuits, making three-dimensional integrated circuits enables the compactness of these circuits to be dramatically improved with respect to their two-dimensional equivalents in which all the electronic components are made in a same level.

In document WO 2011/154360 A1, a method for making a three-dimensional integrated circuit is provided to solve different problems:
- avoiding alignment problems upon superimposing several integrated circuits made independently of each other;
- avoiding degrading levels of electrical interconnections and/or lower FET transistors located under an active layer used for making an upper level of transistors (degradations generated in particular by a heat activation of dopants implanted in the active layer, at source and drain regions of the transistors, at a temperature generally higher than about 850° C.).

In this method, a first level of electronic components is first made. A stack including an active layer, in which dopants have already been implanted and heat activated, as well as layers intended to be used for the making of the gates of transistors is then secured to the first level of electronic components. A second level of electronic components is then made from this stack.

Given that the heat activation of the dopants implanted in the active layer is made prior to securing this active layer with the first level of electronic components, this heat activation step does not degrade the electronic components of the first level. Thus, the electronic components of the second level can be made without implementing a step involving heat budgets higher than about 500° C.

However, in this method, making STI ("Shallow Trench Isolation") type isolation regions which enable the active zones of the transistors of the second level to be defined in the active layer, involves etching the layers used for making the gates of the transistors of the second level according to the pattern of these isolation regions. Given that the gate conducting material has to extend beyond the active zones to form gate contacts, further polysilicon depositing and etching are necessary to form these gates and the contact thereof. The polysilicon photolithography and etching that have to be implemented to make these gates become in this case problematic because of the topology formed by the etched layers used for making the gates and which implies that the polysilicon is deposited at different heights (presence of steps between the polysilicon parts deposited onto the gates and those forming the gate contacts next to them). Problems of isolation and parasitic transistor formation can happen.

This topology problem can also be found for transistors of a non-three-dimensional integrated circuit. Indeed, it happens that it is necessary to form a side spacer around a gate, and then to deposit and etch a new polysilicon layer onto the gate and next to the side spacer. In this case, the problems found are identical.

Finally, when the gate is made after the active zone of the transistor has been defined, it can happen that the gate does not fully cover the channel region of the transistor, resulting in problems of isolation and parasitic transistor formation.

DISCLOSURE OF THE INVENTION

Therefore, there is a need to provide a method for making at least one FET transistor solving at least partly the problems of the methods of prior art discussed above.

For this, one embodiment provides a method for making at least one FET transistor, including implementing the following steps:
- making a gate stack, comprising at least one layer of gate dielectric on which a layer of gate conducting material is arranged, on a layer of crystalline semiconductor;
- etching the layer of gate conducting material such that a remaining portion of the layer of gate conducting material fully covers a first portion of the layer of semiconductor intended to form an active zone of the transistor and at least one second portion of the layer of semiconductor intended to be adjacent to the active zone;
- implanting atoms and/or dopants, in the layer of semiconductor, making the semiconductor located around the first portion as well as the semiconductor of the second portion amorphous and preserving the crystalline nature of the semiconductor of the first portion which forms the active zone;
- etching the remaining portion of the layer of gate conducting material and the layer of gate dielectric according to a gate pattern covering a part of the first portion and at least one part of the second portion, forming the gate of the transistor and at least one gate overflow;
- etching the amorphous semiconductor of the layer of semiconductor.

In this method, a first etching of the gate stack is implemented in order to predefine, around or next to the active zone, a region of the layer of semiconductor which is not intended to be part of the active zone and on which the gate conducting material is not etched such that it can form a gate overflow thereafter. The amorphising implantation made thereby enables the active zone to be defined within the layer of semiconductor while preserving the portion of the gate conducting material intended to form the gate overflow. Etching the amorphous material made thereby enables then the semiconductor located around the active zone to be removed while preserving the gate conducting material and the gate dielectric previously shaped. Thus, no deposition of gate conducting material at different heights is implemented. This method thus eliminates the gate topology problems in the methods of prior art.

Further, because the etching of the layer of gate conducting material is implemented such that the remaining portion of the layer of gate conducting material fully covers the semiconductor portion intended to form the active zone and the second semiconductor portion, the risk that the gate does not fully covers the channel region of the transistor is eliminated, avoiding the occurrence of problems of isolation and parasitic transistor formation.

Further, this method enables a reliable FET transistor to be made, even when the FET transistor has the requirement to have to be made with low heat budgets. Indeed, when a FET transistor has to be made without implementing significant heat budgets, for example lower than or equal to about 500° C. (for example when the FET transistor is arranged in an upper level of a three-dimensional integrated circuit and that the steps implemented for making this FET transistor must not exceed this temperature in order not to degrade the transistors of the lower level(s) of the integrated circuit), this can be problematic because if the gate can only undergo annealings at temperatures lower than or equal to about 500° C., the reliability of this gate is not suitable. The method provided herein is quite compatible with the fact that the gate stack can be exposed to significant temperatures, for example higher than 500° C. and for example in the order of 800° C. or more, before it is transferred on the layer of crystalline semiconductor used for making the active zone of the transistor. The steps requiring a significant heat budget can thus be implemented before this transfer.

Etching the layer of gate conducting material may be such that, in a plane including a surface of a remaining portion of the layer of gate conducting material in contact with the layer of gate dielectric, said surface coincides with the surface, in a plane parallel to a face of the layer of crystalline semiconductor in contact with the layer of gate dielectric, of a first portion of the layer of semiconductor intended to form an active zone of the transistor and of a second portion of the layer of semiconductor intended to be adjacent to the active zone.

In other words, the projection, in the plane lying at the interface of the remaining portion of the layer of gate conducting material and the layer of gate dielectric, of the surface of the set formed by the first and second portions corresponds to the surface of the remaining portion of the layer of gate conducting material in this same plane.

The FET transistor may correspond to a MOSFET or MISFET transistor.

A surface of the remaining portion of the layer of gate conducting material, in a plane parallel to an interface between the remaining portion of the layer of gate conducting material and the layer of gate dielectric, may be of a substantially rectangular shape, and/or a surface of the first portion of the layer of semiconductor, in a plane parallel to an interface between the first portion of the layer of semiconductor and the layer of gate dielectric, may be of a substantially rectangular shape.

The second portion of the layer of semiconductor may be adjacent to at least one side of the first portion of the layer of semiconductor. For example, in the case of a substantially rectangular shaped first portion, the second portion of the layer of semiconductor may correspond to a part adjacent to one of the sides of the first portion. It is also possible to have two, three or four second portions each adjacent to one of the sides of the first portion.

The second portion of the layer of semiconductor may surround the first portion of the layer of semiconductor. It is for example possible to have the second portion forming a ring or a frame around the first portion.

The layer of gate dielectric may include a high permittivity dielectric material (so-called "high-k" dielectric), and/or the layer of gate conducting material may include polycrystalline silicon, or polysilicon.

The method may further include, between the etching step forming the transistor gate and the step of etching the amorphous semiconductor of the layer of semiconductor, implementing a step of making a first dielectric spacer around the gate and the gate overflow.

The method may further include, after the step of etching the amorphous semiconductor of the layer of semiconductor, implementing a step of making a second dielectric spacer around the gate and the gate overflow and such that a portion of the second dielectric spacer fully fills a cavity formed under the gate overflow by etching the amorphous semiconductor of the second portion of the layer of semiconductor. By filling the space located under the gate overflow in this way, the electrical isolation of the active zone of the transistor is improved.

There is also provided a method for making an integrated circuit, including the implementation of a method as described above, and such that this method makes several FET transistors each including their active zone formed in a same layer of semiconductor. The method for making the transistor is thus advantageously implemented to collectively make several FET transistors within a same level of electronic or microelectronic components.

The integrated circuit made may be three-dimensional, and the method may include, before implementing the method described above, the following steps:
  making at least one first level of electronic (or microelectronic) components including FET type transistors and at least one level of electrical interconnections on the first level of electronic components;
  securing a layer of semiconductor to the level of electrical interconnections;
  and wherein implementing the method described above makes several FET transistors each including their active zone formed in said layer of semiconductor and forming at least one second level of electronic (or microelectronic) components of the three-dimensional integrated circuit.

In this case, because the active zones of the transistors of the second level of components are defined after the layer of semiconductor is secured to the level of electrical interconnections (and thus to the first level of electronic components), there is no alignment problem of the active zones of the transistors of the second level with respect to the electrical interconnections located under the second level of electronic components.

Securing the layer of semiconductor to the level of electrical interconnections includes implementing a direct bonding between a first layer of semiconductor oxide corresponding to the buried dielectric layer of a semiconductor on isolator type substrate the superficial layer of which corresponds to the layer of semiconductor, and a second layer of semiconductor oxide formed beforehand on the level of electrical interconnections.

Making the gate stack on the layer of crystalline semiconductor may include a prior step of heat treating the gate stack at a temperature higher than about 500° C., for example higher than or equal to about 800° C., and then a transfer on the gate stack to the layer of crystalline semiconductor.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figures more readable.

The different possibilities (alternatives and embodiments) have to be understood as being not exclusive to each other and can be combined to each other.

DETAILED DISCLOSURE OF PARTICULAR EMBODIMENTS

FIGS. 1 to 8C are referred to, which show the steps of a method for making an integrated circuit 100 according to one particular embodiment. During this method, several FET transistors are made.

The circuit 100 is herein a three-dimensional circuit comprising at least two levels of superimposed microelectronic components. In FIGS. 1 to 8C, only the making of two FET transistors 101, 103 within a second level of components is described.

Figure 1:
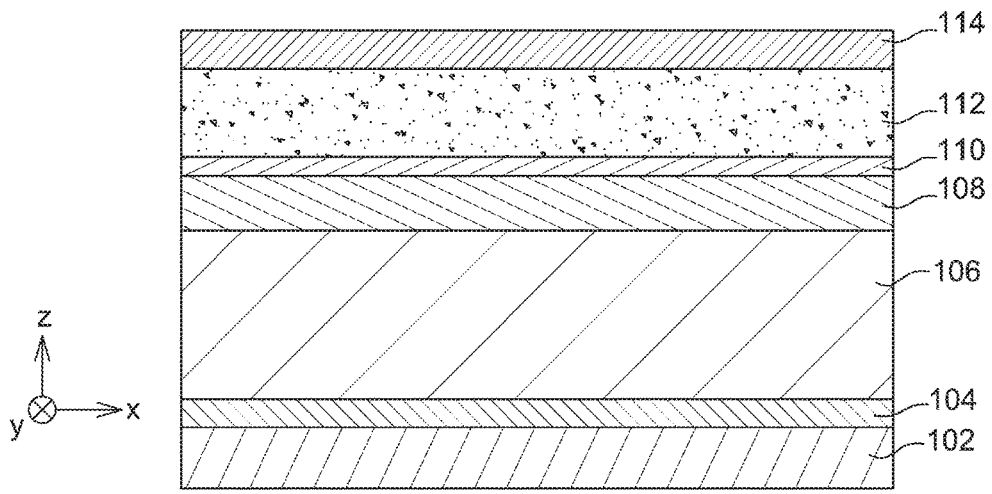
FIGS. 1 to 8C show the steps of a method for making a three-dimensional integrated circuit according to one particular embodiment.

The method is implemented from a structure as shown in FIG. 1. This structure includes a first level of electronic or microelectronic components 102 schematically shown in a simplified manner by a single layer. The first level of components 102 is covered with a first dielectric layer 104, including for example $Si_3N_4$ and acting as a barrier and marking layer for subsequently making electrical connections between the components of the different levels when the circuit 100 is a three-dimensional circuit, or electrical connections with a ground plane for a transistor and its conduction zone. The first dielectric layer 104 is covered with a second dielectric layer 106 comprising for example $SiO_2$.

The second dielectric layer 106 is covered with a layer of crystalline semiconductor 108, comprising for example silicon, intended to form the active layer from which a second level of electronic or microelectronic components is intended to be made. Generally, the crystalline semiconductor of the layer 108 corresponds to a semiconductor such as for example Si, Ge, SiGe, InGaAs, or InAlAs.

The second dielectric layer 106 corresponds for example to the result of securing by direct bonding a layer of semiconductor oxide deposited onto the first dielectric layer 104 and the buried dielectric layer of a SOI substrate, the layer 108 corresponding to the superficial layer of semiconductor of this SOI substrate.

The layer 108 is covered with a layer of gate dielectric 110 intended to form the gate dielectrics of the transistors 101, 103 of the second level of components. This layer 110 includes for example a dielectric with a high dielectric permittivity ("high-k dielectric"), such as $HfO_2$.

The layer 110 is covered with a layer of gate conducting material 112 intended to form the gate conductors of the transistors 101, 103 of the second level. The layer 112 includes for example polycrystalline silicon.

Finally, the layer 112 is covered with a layer 114 intended to make etching masks. This layer 114 includes for example SiN.

Figure 2A:
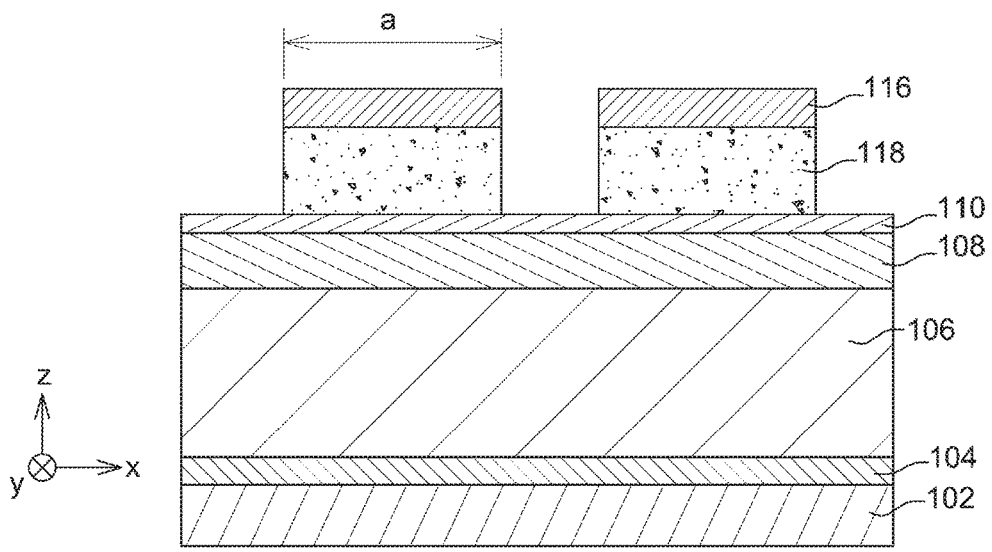
Figure 2B:
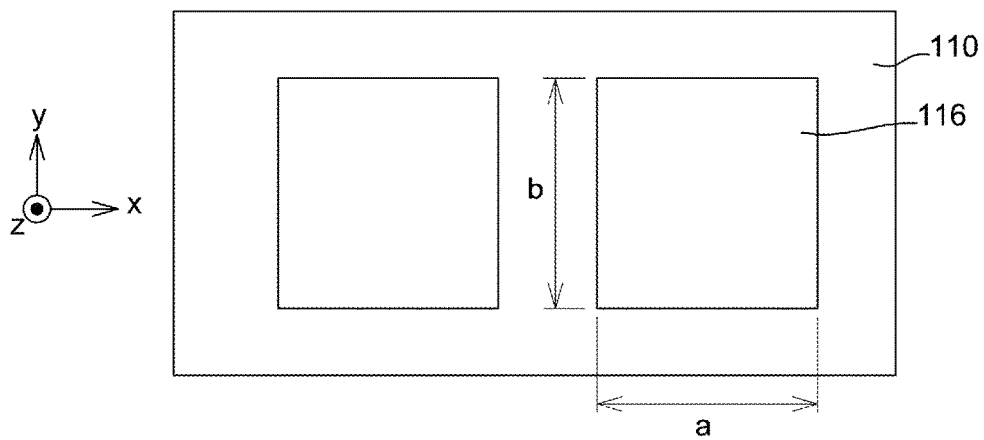
Figure 2C:
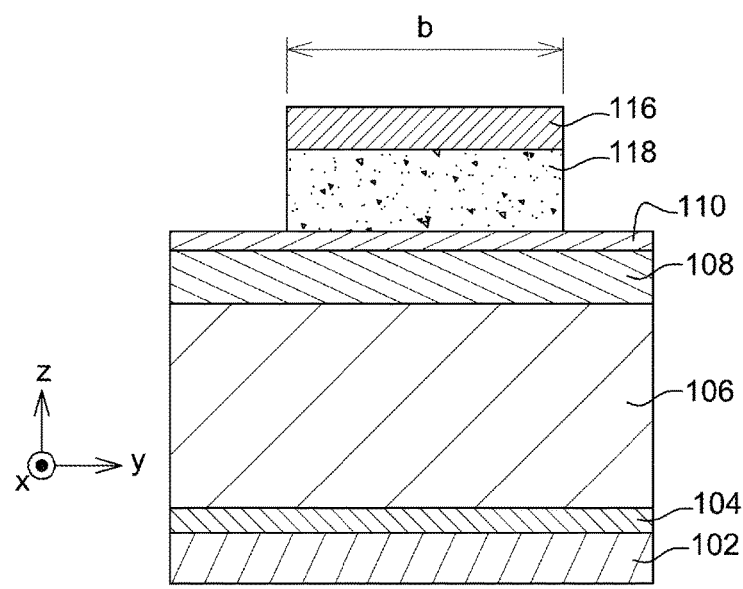

As shown in FIGS. 2A to 2C, the layer 114 is etched according to a pattern transferred thereafter into the layer 112. The etching is stopped on the layer 110. Reference 116 designates each of the remaining portions of the layer 114 and reference 118 designates each of the remaining portions of the layer 112.

The etching pattern of the layers 112, 114 defines, for each of the transistors intended to be made in the second level of components, a set formed by a remaining portion 118 of the layer 112 covered with a remaining portion 116 of the layer 114, the shape and dimensions of which, in the plane (X, Y), are partly defined by the shape and dimensions of the active zones of the transistors intended to be made in the layer 108. Indeed, each set formed with one of the portions 118 which is covered with one of the portions 116 is such that it fully covers a first portion of the layer 108 intended to form the active zone of the transistor and a second portion which is not intended to be part of this active zone but which is intended to be adjacent to the active zone.

In other words, the projection, in the plane located at the interface of the remaining portion 118 and the layer 110 (which corresponds to a plane parallel to both main faces of the active layer 108 which are in contact with the layers 110 and 106 and which are parallel to the plane (X, Y)) of the surface of the set formed with the first and second portions corresponds to the surface of the remaining portion 118 in the same plane. In the example of FIGS. 2A-2C, each set of portions 116, 118 has, in the plane (X, Y), a substantially rectangular shape with dimensions a×b.

Figure 3A:
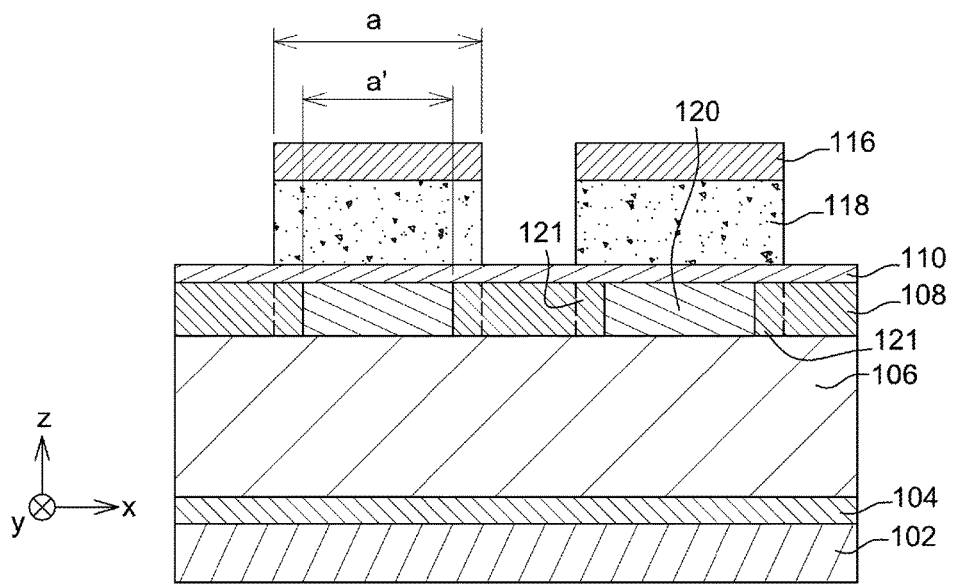
Figure 3B:
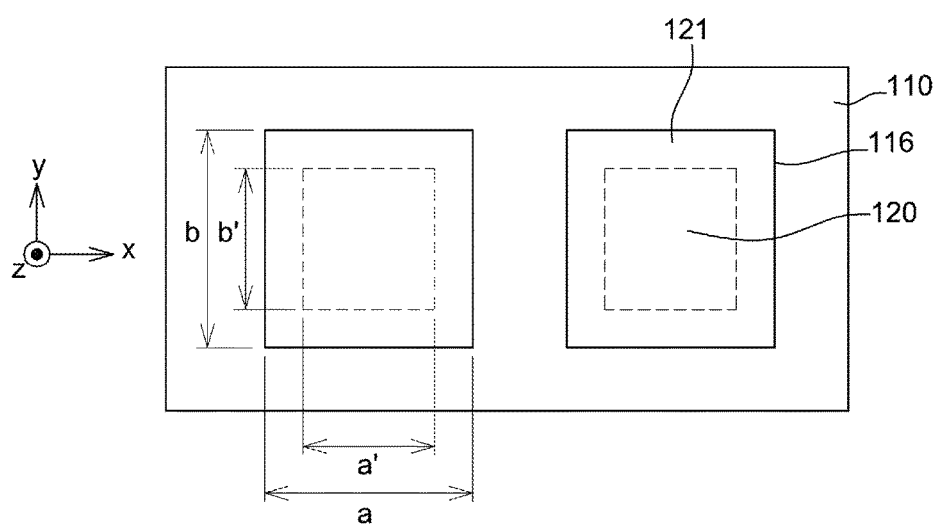
Figure 3C:
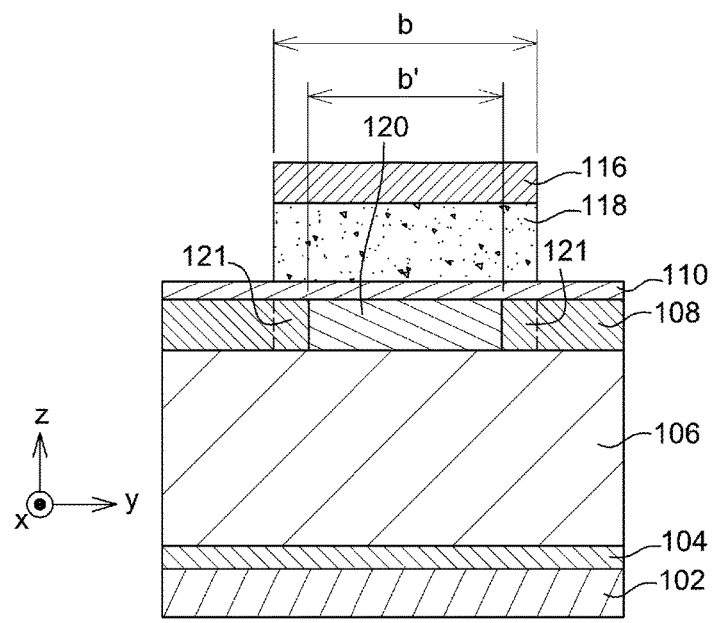

The active zones 120 of the transistors 101, 103 of the second level of components (which correspond to the first portions of the layer 108 mentioned above) are thereafter defined by implanting atoms and/or dopants in the layer 108, making the semiconductor in which these atoms and/or these dopants are implanted and which is located around the active zones 120 amorphous (see FIGS. 3A-3C). Because these atoms and/or dopants are not implanted in the active zones 120, the semiconductor of these active zones 120 is not modified and corresponds to the initial crystalline semiconductor of the layer 108. Preferably, this implantation corresponds to an implantation of atoms, for example of silicon and/or germanium. This implantation is made with beams forming an angle different from 90° with respect to the surface of the layer 110 through which the implantation is made (the beams of atoms and/or dopants being not perpendicular to this surface). This angle enables the atoms and/or dopants to be implanted in the second portion(s) of the layer 108 which are covered with the remaining portions 118+116. In this particular embodiment described herein, this implantation is made all around the first regions intended to form the active zones 120.

At the end of this implantation, the active zones 120 are thus defined and correspond to the portions of crystalline semiconductor which have not undergone this implantation and which are surrounded by the rest of the layer 108 of amorphous semiconductor.

The shape and dimensions of the active zones 120 are such that in the main plane of the active layer 108, the surface occupied by each of the active zones 120 is covered with that formed by the projection of one of the sets of portions 116+118. Thus, in the particular embodiment described herein, each of the active zones 120 has, in the plane (X, Y), a substantially rectangular shape with dimensions a'×b'. But, because a>a', b>b', and each of the sets of portions 116+118 is arranged above one of the active zones 120, the edges of the portions 116+118 are arranged above the second portions 121 of the layer 108 that have undergone the previous implantation and thus comprising amorphous semiconductor. The second portions 121 of the layer 108 here surround the active zones 120. The dimensions a, a', b and b' can be such that these second portions 121 each have a width (this width being equal to (a−a')/2 or (b−b')/2, and corresponds to the dimension substantially perpendicular to the edge of the active zone 120 against which each of these second portions 121 is located) for example equal to about 40 nm and more generally between about 30 nm and 50 nm.

Figure 4A:
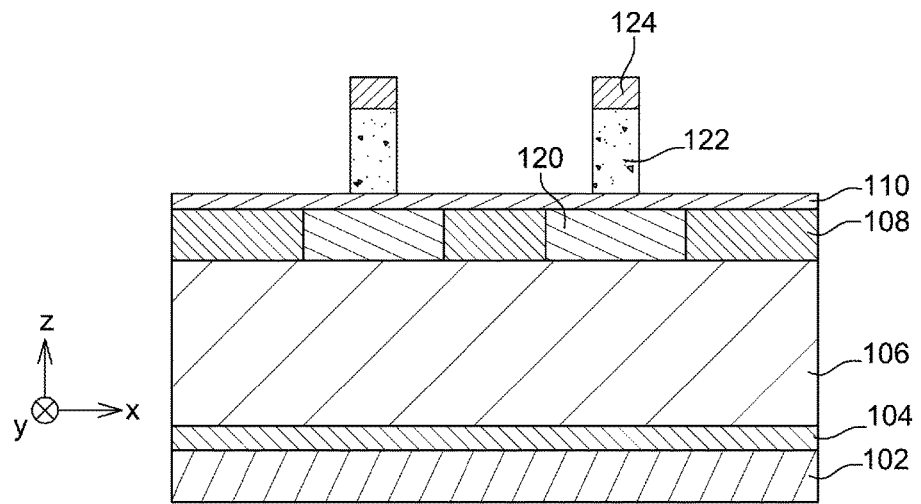
Figure 4B:
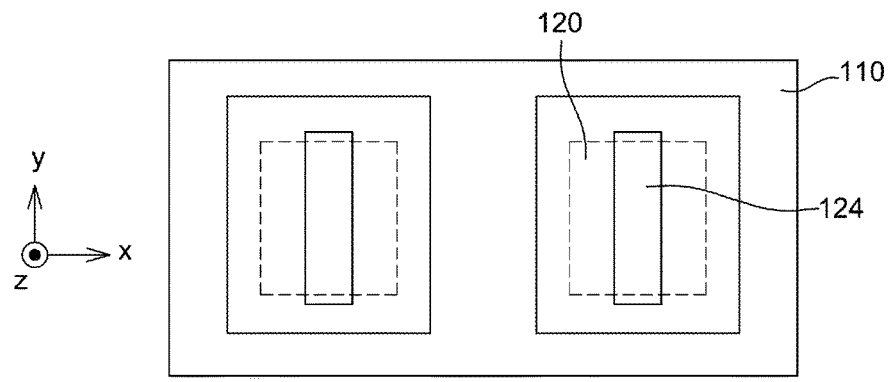
Figure 4C:
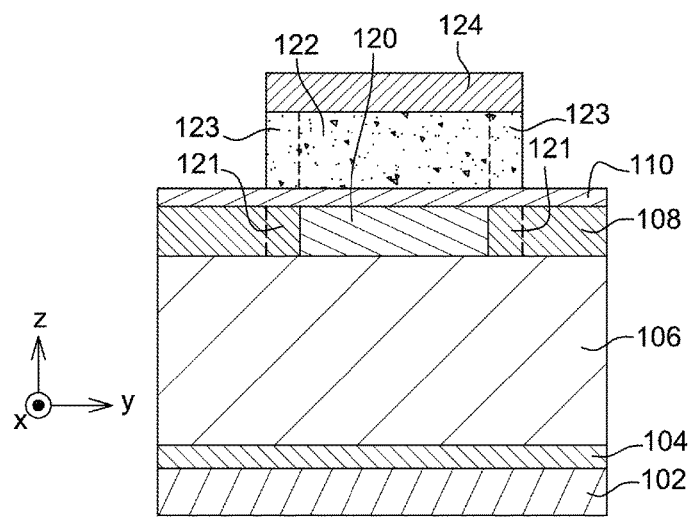

The remaining portions 116 and 118 are then etched (stopping on the layer 110 not to etch the layer 108) in order to form the conducting portions intended to form the gates 122 of the transistors of the second level of components (FIGS. 4A-4C). These conducting portions have, on top of them, portions 124 from the portions 116 and used for defining the pattern to be etched in the portions 118.

Because the active zones 120 have been previously made such that parts of the portions 116 and 118 cover the second portions 121 of the layer 108 arranged about the active zones 120, a part of these second portions 121 of the layer 108 which are juxtaposed to the active zones 120 (and thus comprising amorphous semiconductor) remain covered with parts of the conducting portions from the portions 118 and which form gate overflows 123.

Figure 5A:
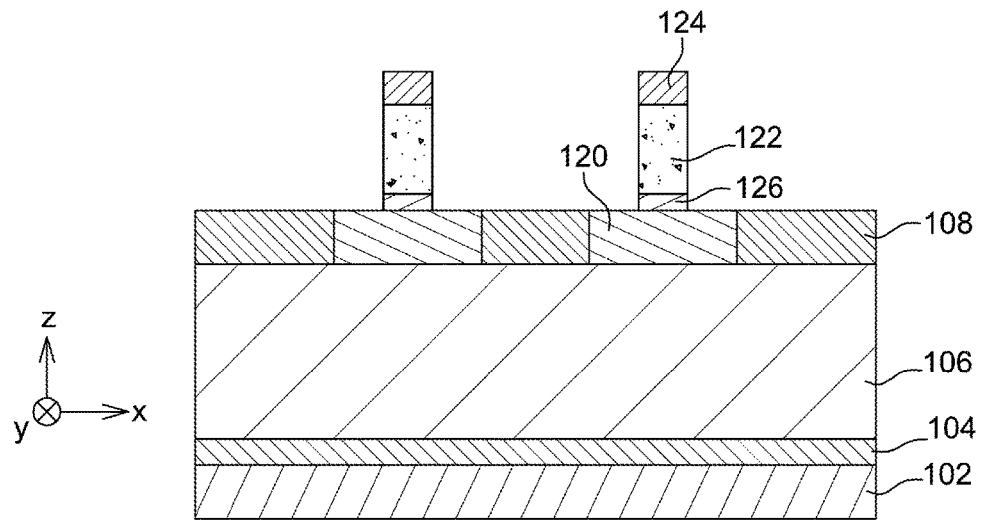
Figure 5B:
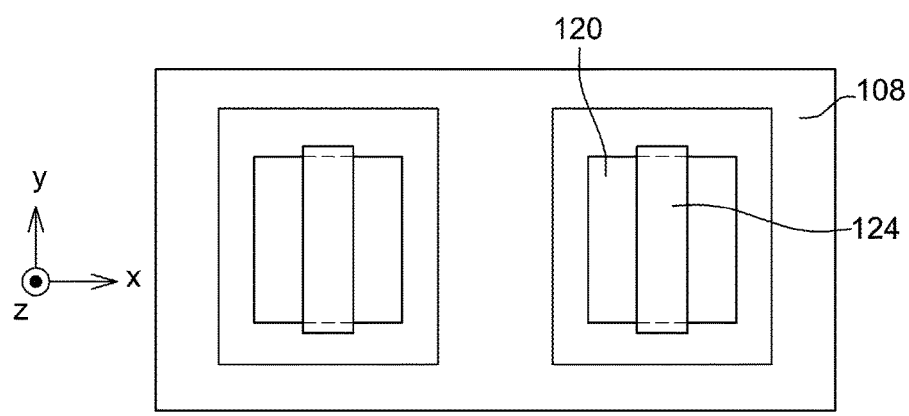
Figure 5C:
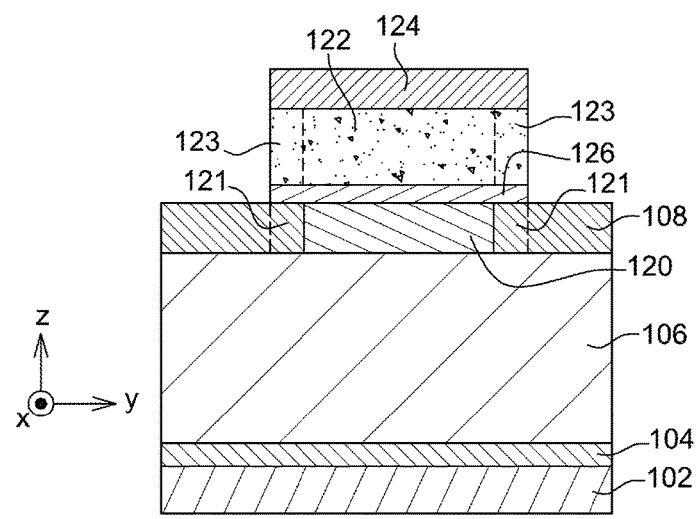

As shown in FIGS. 5A-5C, the layer 110 is then etched according to the gate pattern defined by the gates 122 and the gate overflows 123. At the end of this etching, the remaining portions of the layer 110 form gate dielectrics 126 which cover a part of the active zones 120, as well as a part of the second portions 121 of the layer 108 which are juxtaposed to the active zones 120, at the gate overflows 123. The gate dielectrics 126 are covered with the gates 122 and the gate overflows 123.

Figure 6A:
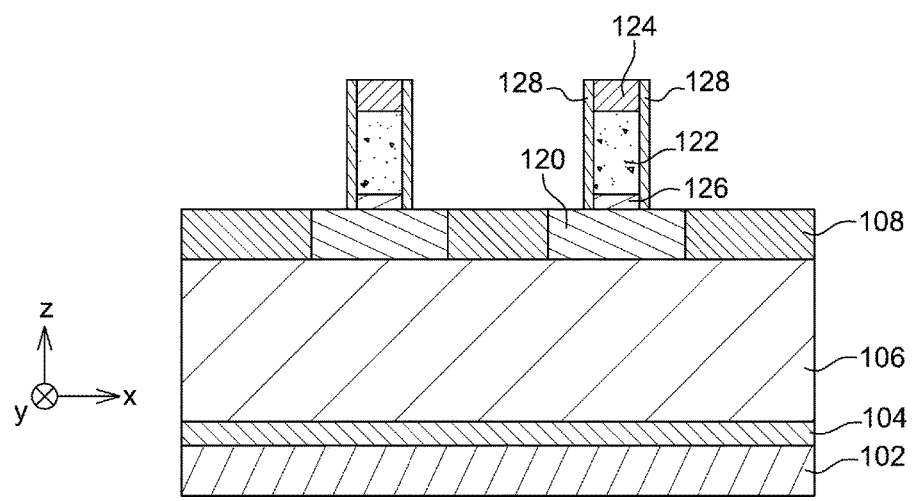
Figure 6B:
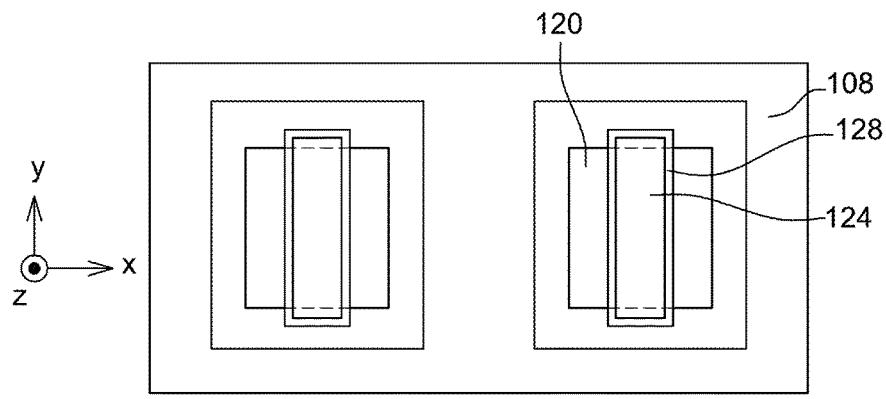
Figure 6C:
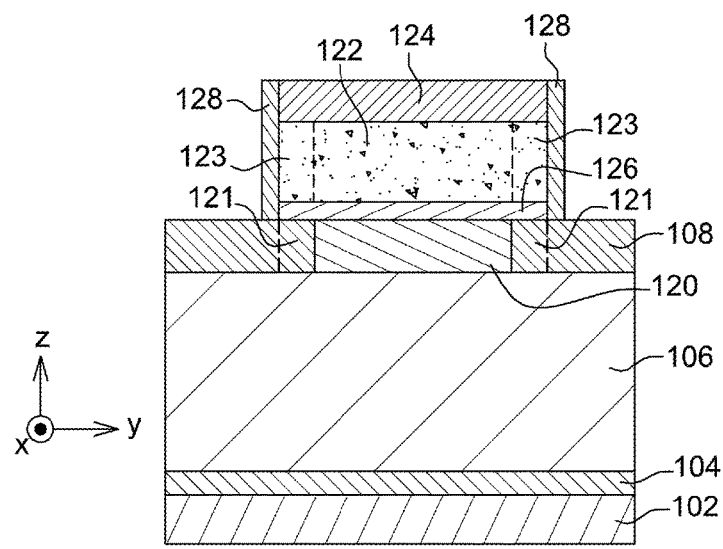

Gate spacers 128 are then made on the layer 108, around the stacks formed by superimposing the gate dielectrics 126, gates 122 and gate overflows 123, and remaining mask portions 124 (FIGS. 6A-6C).

Figure 7A:
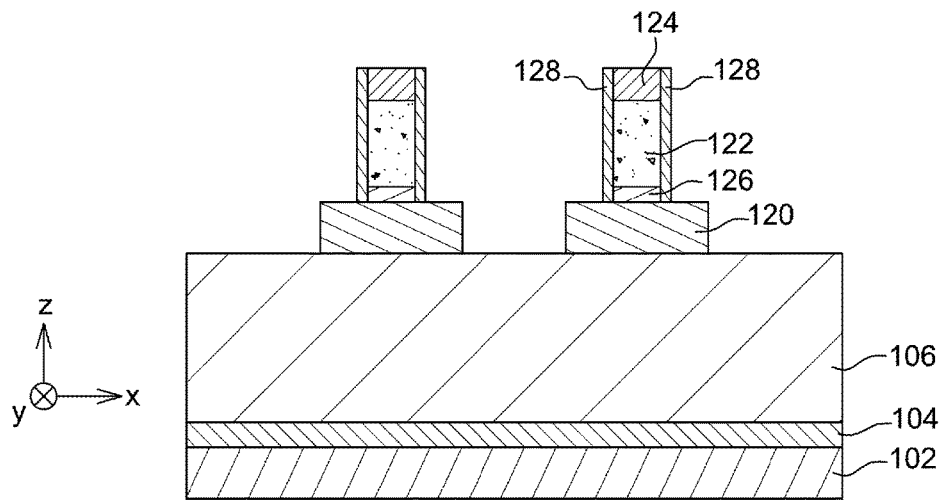
Figure 7B:
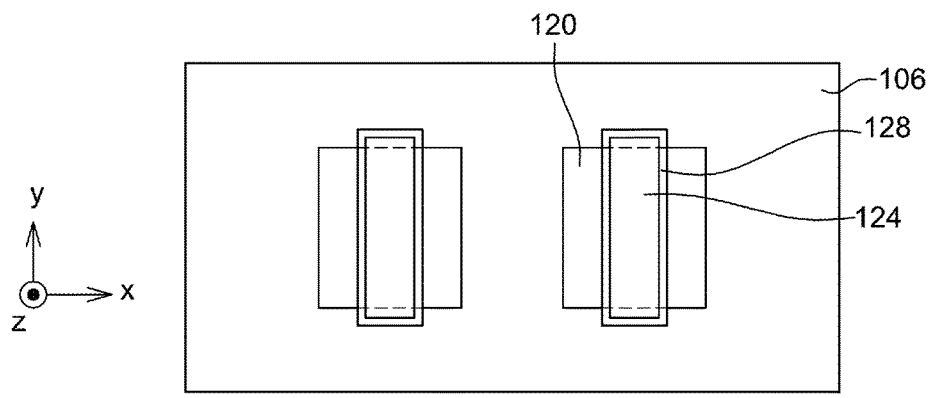
Figure 7C:
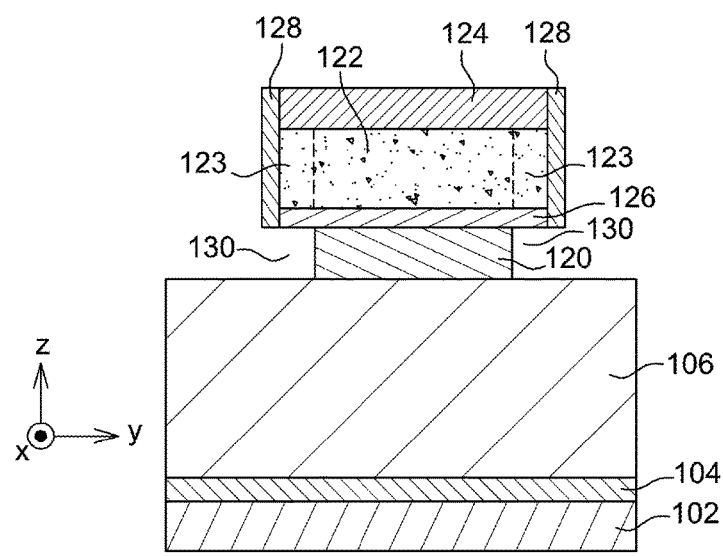

An etching of the amorphous semiconductor of the layer 108, which is selective towards the crystalline semiconductor of the active zones 120, is then implemented. Thus, only the crystalline semiconductor of the active zones 120 is preserved on the dielectric layer 106 (FIGS. 7A-7C). The second portions 121 of the layer 108 are also eliminated by this etching, thus forming cavities 130 present under the gate overflows 123.

Figure 8A:
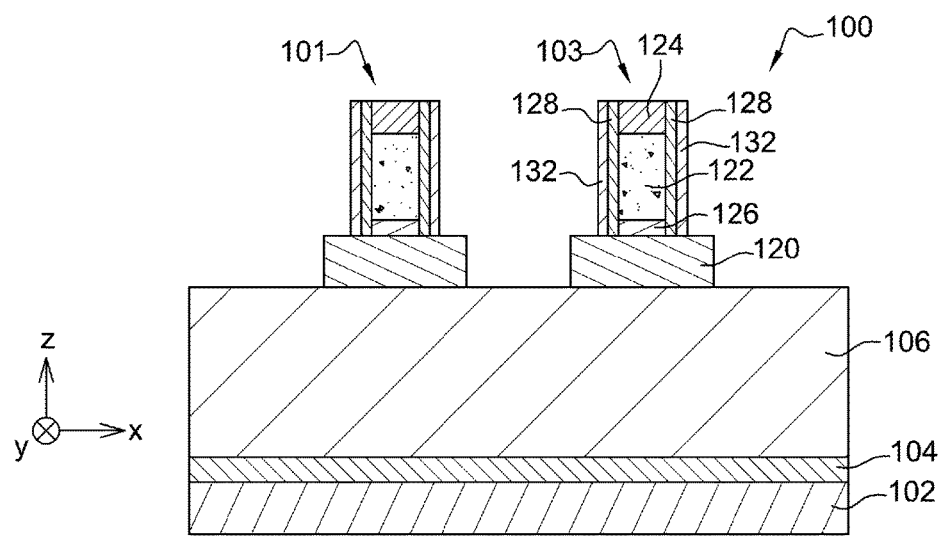
Figure 8B:
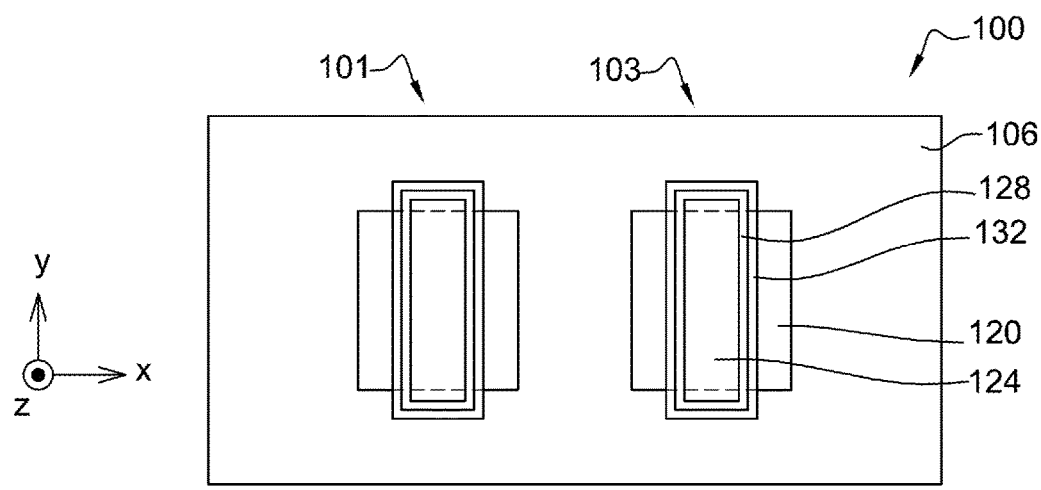
Figure 8C:
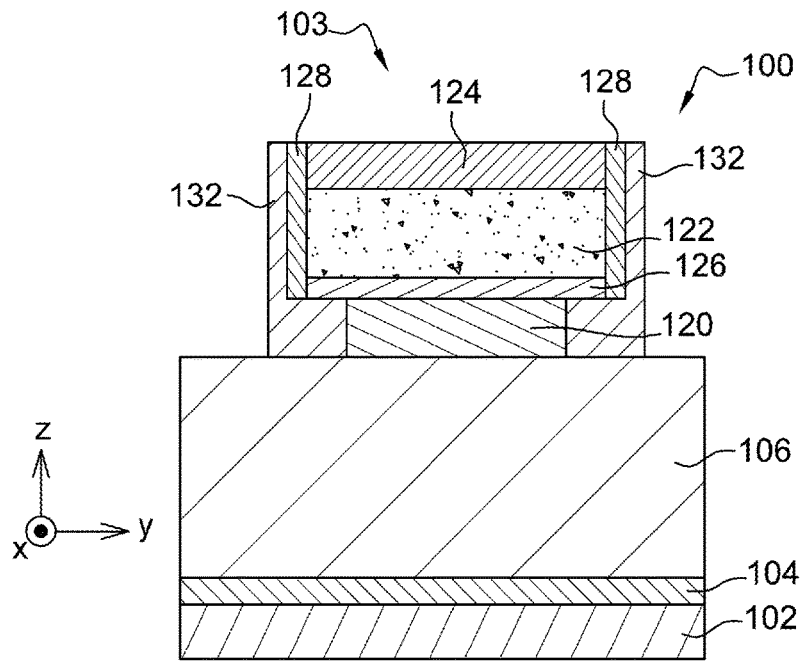

Advantageously, a second spacer 132 is deposited around the first spacer 128 as well as in the cavities 130 (FIGS. 8A-8C). The cavities 130 are then filled with a dielectric material protecting the edges of the active zones 120, which improves electrical isolation of the active zones 120 and facilitates completion of the transistors 101, 103 of the second level of components (making the electrical contacts of the transistors, full plate deposition and planarization of a dielectric, making metallic interconnections, etc.).

In the particular embodiment previously described, each of the active zones 120 is made such that second portions 121 of the layer 108 located all around the active zone 120 are covered with the portions 116, 118 used for making the gate 122 and the gate overflows 123. Alternatively, it is possible that the implantation made with a tilted beam of atoms and/or ions is not implemented at all the sides of the active zone 120, but only at some sides of the active zone 120, or even on a single side of the active zone 120. At the other sides of the active zone 120, the implantation can be made with a beam oriented substantially perpendicular to the upper face of the layer 110.

Figure 9A:
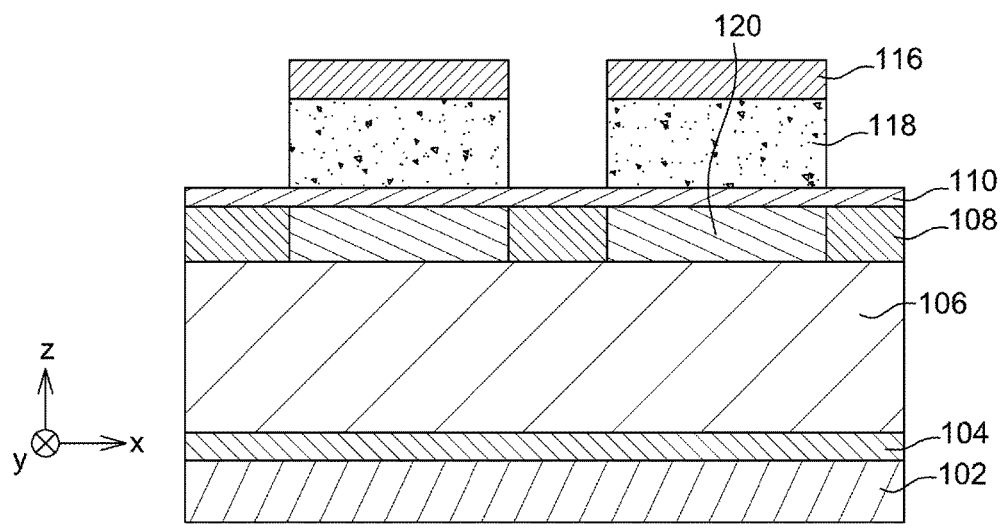
FIGS. 9A to 10C show a part of the steps of a method for making a three-dimensional integrated circuit according to a particular alternative embodiment.
Figure 9B:
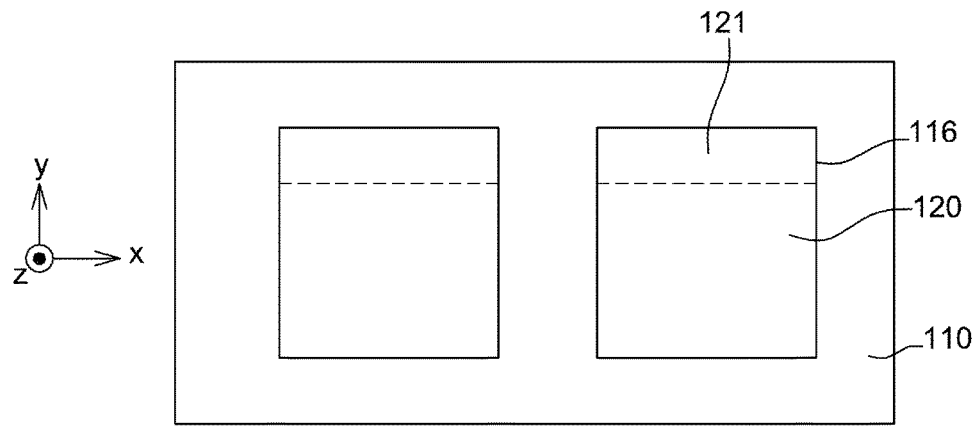
Figure 9C:
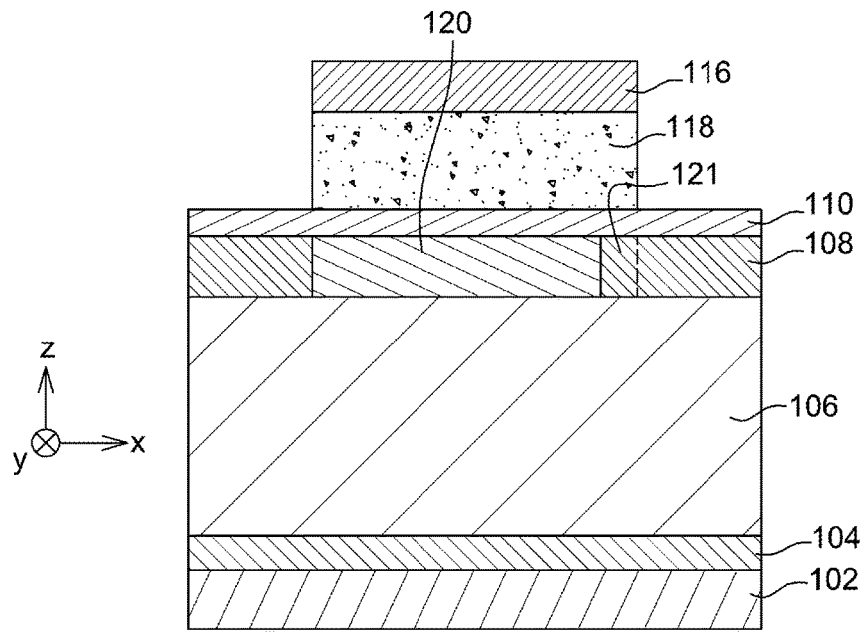

The result obtained at the end of this implantation is shown in FIGS. 9A-9C. In these figures, only the implantation made in parallel to the axis X, at one of both sides of the active zone 120 which are parallel to the axis X, is implemented with a tilted beam towards the upper surface of the layer 110. Thus, the second portions 121 of the layer 108 arranged under the portions 118 and 116 are arranged at a single side of each of the active zones 120.

Then, as in the particular embodiment previously described, the portions 116 and 118 are etched with stopping on the layer 110, forming the gates 122 of the transistors and the gate overflows 123. The layer 110 is then etched according to the gate pattern defined by the gates 122 and the gate overflows 123. Having defined the active zone 120 such that a second portion 121 of the layer 108 is only present on a single side of the active zone 120, the gate overflow 123 only projects from the active zone 120 at this single side.

The gate spacers 128 are then made on the layer 108 and the active zones 120, around stacks formed by superimposing the gate dielectrics 126, the gates 122 and the gate overflows 123 and the mask portions 124.

Etching the amorphous semiconductor of the layer 108, which is selective towards the crystalline semiconductor of the active zones 120, is then implemented. The second portions 121 of the layer 108 are also eliminated by this etching, thus forming cavities 130 present under the gate overflows 123.

Figure 10A:
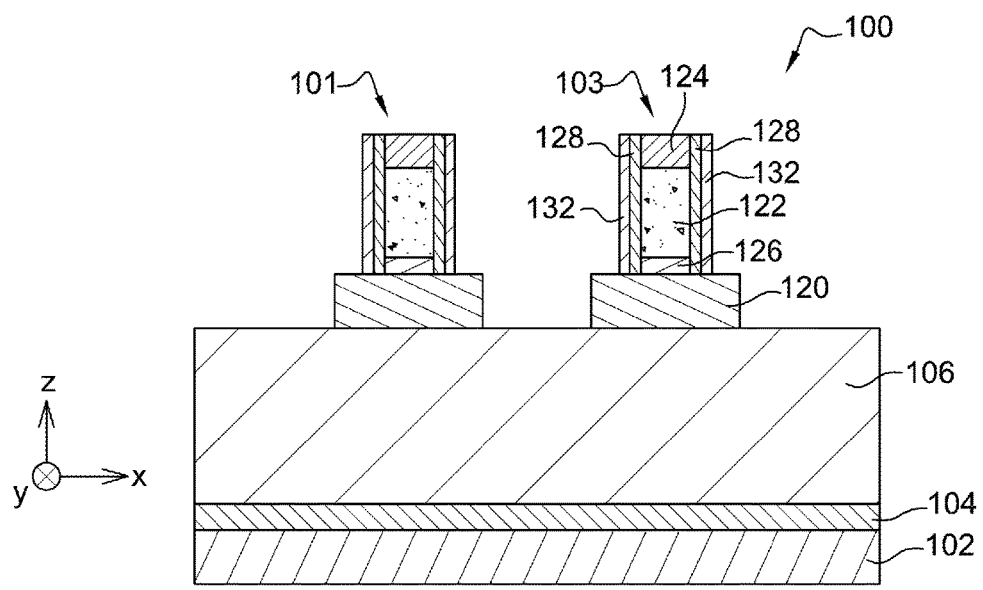
Figure 10B:
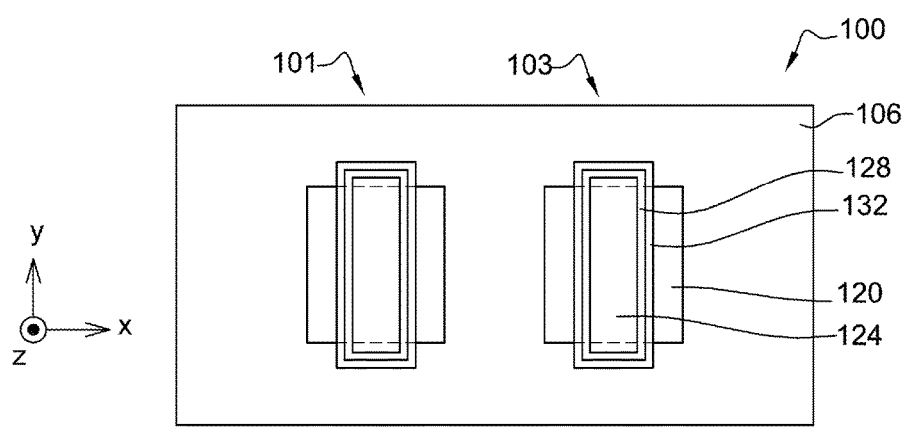
Figure 10C:
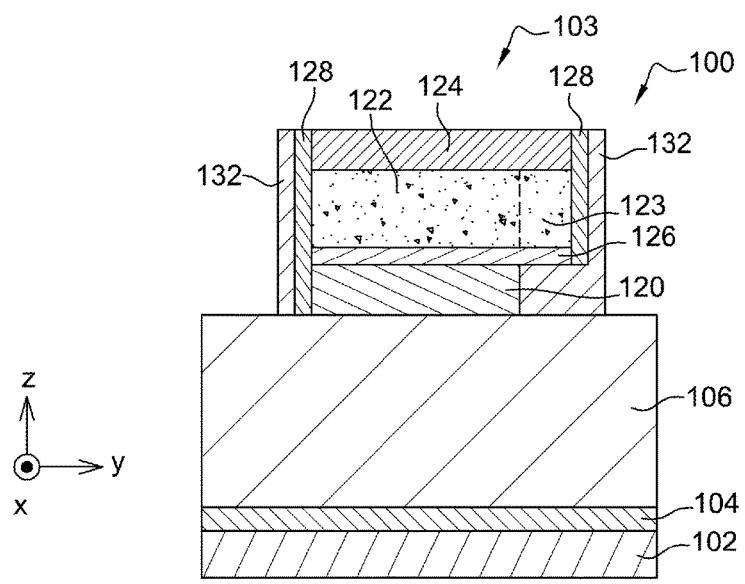

A second spacer 132 can be deposited around the first spacer 128 as well as in the cavities 130. The structure obtained is shown in FIGS. 10A-10C.

In the methods described above, the heat activation of dopants implanted in the source and drain can be made by Solid Phase Epitaxy Regrowth (SPER) implemented at a temperature for example lower than or equal to about 500° C., or by laser with pulses of a time duration equal to or lower than about 100 ns such that the high temperature (for example in the order of 1 200° C.) reached in the regions aimed at by the laser does not propagate in the lower layers which remain at temperatures lower than about 500° C.

The invention claimed is:

1. A method for making at least one FET transistor, including:
   making a gate stack, comprising at least one layer of gate dielectric on which a layer of gate conducting material is arranged, on a layer of crystalline semiconductor,
   etching the layer of gate conducting material such that a remaining portion of the layer of gate conducting material fully covers a first portion of the layer of semiconductor intended to form an active zone of the transistor and at least one second portion of the layer of semiconductor intended to be adjacent to the active zone,
   implanting atoms, or dopants, or atoms and dopants, in the layer of semiconductor, making the semiconductor located around the first portion as well as the semiconductor of the second portion amorphous and preserving the crystalline nature of the semiconductor of the first portion which forms the active zone,
   etching the remaining portion of the layer of gate conducting material and the layer of gate dielectric according to a gate pattern covering a part of the first portion and at least one part of the second portion, forming the gate of the transistor and at least one gate overflow,
   etching the amorphous semiconductor of the layer of semiconductor.

2. The method according to claim 1, wherein at least one of the following properties is fulfilled:
   a surface of the remaining portion of the layer of gate conducting material, in a plane parallel to an interface between the remaining portion of the layer of gate conducting material and the layer of gate dielectric, is of a substantially rectangular shape, and
   a surface of the first portion of the layer of semiconductor, in a plane parallel to an interface between the first portion of the layer of semiconductor and the layer of gate dielectric, is of a substantially rectangular shape.

3. The method according to claim 1, wherein the second portion of the layer of semiconductor is adjacent to at least one side of the first portion of the layer of semiconductor.

4. The method according to claim 1, wherein the second portion of the layer of semiconductor surrounds the first portion of the layer of semiconductor.

5. The method according to claim 1, wherein at least one of the following properties is fulfilled:
the layer of gate dielectric includes a high-permittivity dielectric material,
the layer of gate conducting material includes polycrystalline silicon.

6. The method according to claim 1, further including, between the etching step forming the transistor gate and the step of etching the amorphous semiconductor of the layer of semiconductor, implementing a step of making a first dielectric spacer around the gate and the gate overflow.

7. The method according to claim 1, further including, after the step of etching the amorphous semiconductor of the layer of semiconductor, implementing a step of making a second dielectric spacer around the gate and the gate overflow and such that a portion of the second dielectric spacer fully fills a cavity formed under the gate overflow by etching the amorphous semiconductor of the second portion of the layer of semiconductor.

8. A method for making an integrated circuit, including implementing a method according to claim 1 such that this method makes several FET transistors each including their active zone made in a same layer of semiconductor.

9. The method according to claim 8, wherein the integrated circuit made is three-dimensional, and including, before making the gate stack making the gate stack, the following steps of:
making at least one first level of electronic components including FET type transistors and at least one level of electrical interconnections on the first level of electronic components,
securing a layer of semiconductor to the level of electrical interconnections,
and wherein implementing the method according to claim 1 makes several FET transistors each including their active zone formed in said layer of semiconductor and forming at least one second level of electronic components of the three-dimensional integrated circuit.

10. The method according to claim 9, wherein securing the layer of semiconductor to the level of electrical interconnections includes implementing a direct bonding between a first layer of semiconductor oxide corresponding to the buried dielectric layer of a semiconductor on isolator type substrate the superficial layer of which corresponds to the layer of semiconductor, and a second layer of semiconductor oxide made beforehand on the level of electrical interconnections.

11. The method according to claim 1, wherein making the gate stack on the layer of crystalline semiconductor includes a prior step of heat treating the gate stack at a temperature higher than about 500° C., and then a transfer of the gate stack to the layer of crystalline semiconductor.

* * * * *